United States Patent
Tanaka et al.

(10) Patent No.: US 7,705,399 B2
(45) Date of Patent: Apr. 27, 2010

(54) SEMICONDUCTOR DEVICE WITH FIELD INSULATION FILM FORMED THEREIN

(75) Inventors: Shuji Tanaka, Gunma (JP); Shuichi Kikuchi, Gunma (JP); Kiyofumi Nakaya, Saitama (JP)

(73) Assignee: SANYO Electric Co., Ltd., Osaka (JP)

( * ) Notice: Subject to any disclaimer, the term of this patent is extended or adjusted under 35 U.S.C. 154(b) by 67 days.

(21) Appl. No.: 11/708,685

(22) Filed: Feb. 21, 2007

(65) Prior Publication Data

US 2007/0200171 A1    Aug. 30, 2007

(30) Foreign Application Priority Data

Feb. 24, 2006    (JP) .............................. 2006-048374

(51) Int. Cl.
*H01L 29/76* (2006.01)
(52) U.S. Cl. .................. 257/341; 257/337; 257/492
(58) Field of Classification Search ................ 257/337, 257/341, 492, E21.427, E29.268
See application file for complete search history.

(56) References Cited

U.S. PATENT DOCUMENTS

| | | | |
|---|---|---|---|
| 4,987,465 | A | 1/1991 | Longcor et al. |
| 5,294,824 | A | 3/1994 | Okada |
| 6,211,552 | B1 | 4/2001 | Efland et al. |
| 6,445,038 | B1 | 9/2002 | Tihanyi |
| 6,693,338 | B2 * | 2/2004 | Saitoh et al. ................ 257/492 |
| 7,576,388 | B1 | 8/2009 | Wilson et al. |
| 2001/0009287 | A1 * | 7/2001 | Fujihira et al. .............. 257/328 |
| 2001/0053581 | A1 | 12/2001 | Mosher et al. |
| 2003/0027396 | A1 | 2/2003 | Imam et al. |
| 2004/0108544 | A1 | 6/2004 | Hossain et al. |
| 2005/0104124 | A1 * | 5/2005 | Iwabuchi .................... 257/343 |

(Continued)

FOREIGN PATENT DOCUMENTS

EP    0 973 205 A    1/2000

(Continued)

OTHER PUBLICATIONS

European Search Report directed to EP Application No. 07 003 779.1, dated Oct. 16, 2008.

(Continued)

*Primary Examiner*—Lynne A Gurley
*Assistant Examiner*—Vernon P Webb
(74) *Attorney, Agent, or Firm*—Morrison & Foerster LLP (57) ABSTRACT

The invention provides a high voltage MOS transistor having a high gate breakdown voltage and a high source/drain breakdown voltage and having a low on-resistance. A gate electrode is formed on an epitaxial silicon layer with a LOCOS film being interposed therebetween. A P-type first drift layer is formed on the left side of the LOCOS film, and a $P^+$-type source layer is disposed on the surface of the epitaxial silicon layer on the right side of the LOCOS film, being opposed to the first drift layer over the gate electrode. A P-type second drift layer is formed by being diffused in the epitaxial silicon layer deeper than the first drift layer, extending from under the first drift layer to under the left side of the LOCOS film. A recess is formed in a bottom portion of the second drift layer under the left end of the LOCOS film.

8 Claims, 6 Drawing Sheets

U.S. PATENT DOCUMENTS

| | | |
|---|---|---|
| 2005/0230765 A1 | 10/2005 | Ohtake |
| 2005/0253216 A1* | 11/2005 | Tsuchiko .................... 257/491 |
| 2005/0285189 A1 | 12/2005 | Shibib et al. |
| 2006/0022294 A1 | 2/2006 | Petzold et al. |
| 2007/0114569 A1* | 5/2007 | Wu et al. .................... 257/194 |
| 2007/0200171 A1 | 8/2007 | Tanaka et al. |
| 2007/0200195 A1 | 8/2007 | Tanaka et al. |
| 2008/0006818 A1* | 1/2008 | Luo et al. .................... 257/19 |

FOREIGN PATENT DOCUMENTS

| | | |
|---|---|---|
| JP | 2003-343960 A | 12/2003 |
| JP | 2004-039774 | 2/2004 |

OTHER PUBLICATIONS

European Office Action mailed on Jul. 8, 2009 at counterpart application No. 07003778.3-2203; 2 pages.

Tanaka et al., U.S. Office Action, mailed Oct. 17, 2008, directed to U.S. Appl. No. 11/708,682; 9 pages.

Tanaka et al., U.S. Office Action, mailed May 15, 2009, directed to U.S. Appl. No. 11/708,682; 9 pages.

Tanaka et al., U.S. Office Action, mailed Sep. 14, 2009, directed to U.S. Appl. No. 11/708,682; 16 pages.

* cited by examiner

SEMICONDUCTOR DEVICE WITH FIELD INSULATION FILM FORMED THEREIN

CROSS-REFERENCE OF THE INVENTION

This invention claims priority from Japanese Patent Application No. 2006-048374, the content of which is incorporated herein by reference in its entirety.

BACKGROUND OF THE INVENTION

1. Field of the Invention

The invention relates to a semiconductor device and a method of manufacturing the same, particularly, a structure of a high voltage MOS transistor and a method of manufacturing the same.

2. Description of the Related Art

A high voltage MOS transistor has a high source/drain breakdown voltage or a high gate breakdown voltage and is generally used for various drivers such as an LCD driver, a power supply circuit or the like. In recent years, there has been a need for a high voltage transistor having a high source/drain breakdown voltage and a high gate breakdown voltage together. For this purpose, a LOCOS (local oxidation of silicon) film that is basically used as a field insulation film is used as a gate insulation film to enhance the gate breakdown voltage, and at the same time a low concentration drain layer is provided to enhance the source/drain breakdown voltage. The high voltage MOS transistor is disclosed in Japanese Patent Application No. 2004-39774.

SUMMARY OF THE INVENTION

Although a gate breakdown voltage of about 200V is obtained in the above described high voltage MOS transistor, however, electric field crowding occurs at the end of the LOCOS film on the drain side to cause a PN junction breakdown there, thereby causing a problem that the desired source/drain breakdown voltage is not obtained.

The invention provides a semiconductor device including: a semiconductor layer of a first conductivity type; a gate electrode formed on the semiconductor layer with a field insulation film being interposed therebetween; a first drift layer of a second conductivity type; a source layer facing the drift layer with the gate electrode being disposed therebetween; and a second drift layer of a second conductivity type diffused in the semiconductor layer deeper than the first drift layer and extending from under the first drift layer to under the field insulation film, wherein a recess portion is formed in a bottom portion of the second drift layer under an end portion of the field insulation film.

Such a high voltage MOS transistor has a gate breakdown voltage of about 200V, a high source/drain breakdown voltage of about 280V and a low on-resistance.

DETAILED DESCRIPTION OF THE INVENTION

A structure of a high voltage MOS transistor of an embodiment of the invention will be described referring to FIG. 10.

An N-type epitaxial silicon layer 2 is formed on a P-type single crystal silicon substrate 1 by epitaxial growth, and an $N^+$-type embedded silicon layer 3 is formed at an interface of the single crystal silicon substrate 1 and the epitaxial silicon layer 2. A LOCOS film 4 having a thickness of about 1000 nm is formed on the epitaxial silicon layer 2, and a gate electrode 5 is formed on the LOCOS film 4. A P-type first drift layer (P+L) 6 is formed on the surface of the epitaxial silicon layer 2 on the left side of the LOCOS film 4, and a $P^+$-type source layer (PSD) 7 is disposed on the surface of the epitaxial silicon layer 2 on the right side of the LOCOS film 4, facing the first drift layer 6 with the gate electrode 5 therebetween. An $N^+$ layer (NSD) 8 for setting the epitaxial silicon layer 2 to a source potential is formed on the right side of the source layer 7. The conductivity types $N^+$, N and $N^-$ belong to one general conductivity type. Likewise, the conductivity types $P^+$, P and $P^-$ belong to another general conductivity type.

A P-type second drift layer (SP+L) 9 is further formed by being diffused in the epitaxial silicon layer 2 deeper than the first drift layer 6, extending from under the first drift layer 6 to under the left side of the LOCOS film 4. A recess portion R is formed in a lower portion of the second drift layer 9 under the left end of the LOCOS film 4.

A low concentration source layer 10 is formed extending from under the source layer 7 to under the right side of the LOCOS film 4, which is formed at the same time as when the second drift layer 9 is formed. A N-type channel layer (FN) 11 having a higher concentration of impurities than the epitaxial silicon layer 2 is formed between the second drift layer 9 and the low concentration source layer 10 under the LOCOS film 4, being in contact with the bottom portion of the LOCOS film 4.

A P-type drain layer 12 is formed on the left side of the first and second drift layers 6 and 9, being in contact with these layers. The drain layer 12 is made of three P-type layers (a PSD layer, a SP+D layer and a P+D layer), in which the PSD layer on the surface has the highest concentration, the SP+D layer thereunder has the second highest concentration and the P+D layer thereunder has the lowest concentration. Providing the drain layer 12 with such concentration gradient increases the expansion of a depletion layer of the drain layer 12, contributing to realization of a higher voltage MOS transistor.

A first interlayer insulation film 13 having a thickness of about 1000 nm is formed over the gate electrode 5, and a contact hole CH1 is formed in the first interlayer insulation film 13 on the PSD layer of the drain layer 12. A drain electrode 14 made of a first metal layer such as aluminum is formed through this contact hole CH1, being in contact with the PSD layer of the drain layer 12. A contact hole CH2 is further formed in the first interlayer insulation film 13 on the source layer 7 and the $N^+$ layer 8. A source electrode 15 made of the first metal layer such as aluminum is formed through this contact hole CH2, being in contact with the source layer 7 and the $N^+$ layer 8.

A field plate 17 is formed extending from above a portion of the gate electrode 5 to above the first drift layer 6 with the first interlayer insulation film 13 and a second interlayer insulation film 16 having a thickness of about 1000 nm being interposed therebetween. The field plate 17 is made of a second metal layer made of aluminum or the like, and set to the source potential. The field plate 17 serves to expand a depletion layer between the first and second drift layers 6 and 9 and the epitaxial silicon layer 2. The reason the field plate 17 is made of the second metal layer is because a field plate 17 made of the first metal layer causes electric field concentration at the end of the LOCOS film 4 to lower a source/drain breakdown voltage.

The above described high voltage MOS transistor has a high gate breakdown voltage of about 200V since the thick LOCOS film 4 is used as a gate insulation film. Furthermore, since the low concentration drain layer is made of the two layers of the first and second drift layers 6 and 9, the on-resistance of the transistor is reduced.

Furthermore, the recess portion R formed in the bottom portion of the second drift layer 9 reduces the P-type impurity concentration under the end of the LOCOS film 4 locally and increases the area of the PN junction between the recess portion R of the second drift layer 9 and the epitaxial silicon layer 2, so that the expansion of the depletion layer increases when a drain voltage is applied. There is also an effect of the field plate 17 that expands the depletion layer. While this depletion layer expands into the epitaxial silicon layer 2, the N$^+$ type embedded silicon layer 3 formed at the interface of the single crystal silicon substrate 1 and the epitaxial silicon layer 2 prevents the depletion layer from reaching the single crystal silicon substrate 1. The synergetic effect of these realizes a high source/drain breakdown voltage of about 280V. Although the on-resistance slightly increases by the recess portion R formed in the second drift layer 9, this does not create problems practically because it is compensated with the increased concentration of the second drift layer 9.

Figure 11:
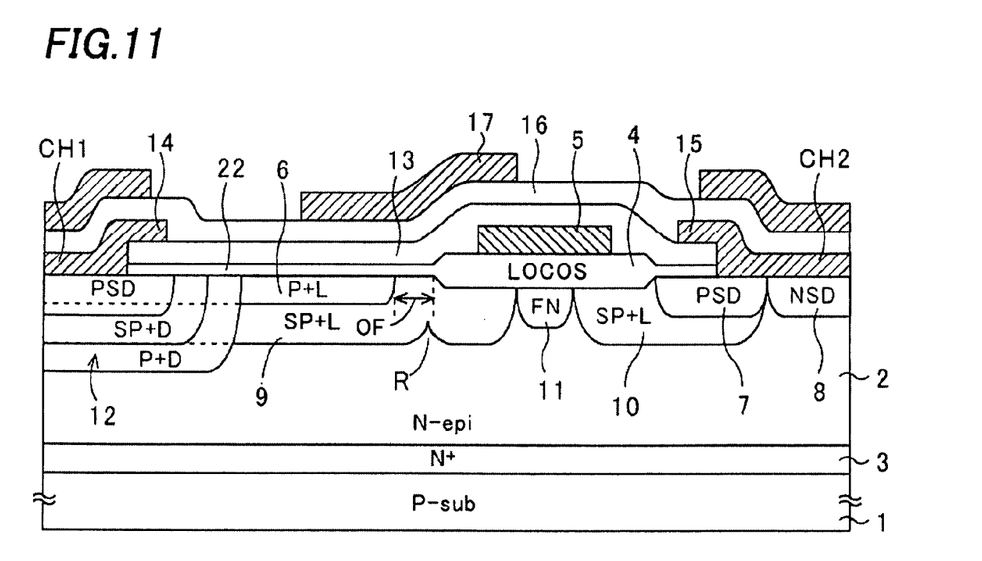

Forming the first drift layer 6 at a distance of offset length OF from the left end of the LOCOS film 4 as shown in FIG. 11 prevents the breakdown of the PN junction at the end of the LOCOS film 4 having a high electric field, thereby further enhancing the source/drain breakdown voltage.

Figure 1:
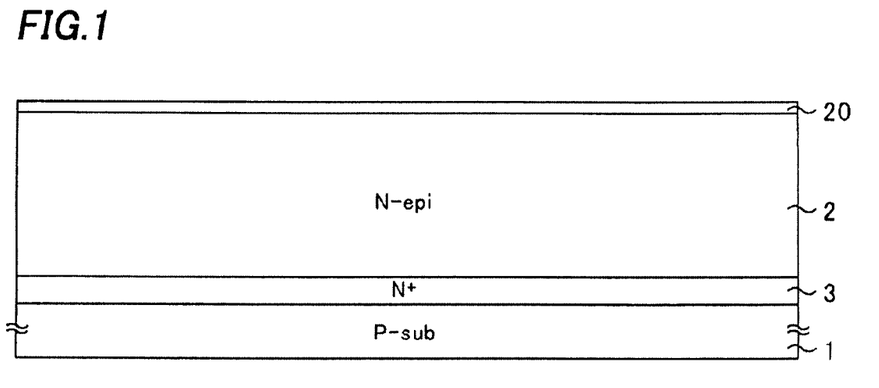
FIGS. 1 to 9 are cross-sectional views for explaining a method of manufacturing a semiconductor device of an embodiment of the invention.

Next, a method of manufacturing the high voltage MOS transistor shown in FIG. 10 will be described referring to figures. As shown in FIG. 1, a high concentration of N-type impurities is ion-implanted in the surface of the P-type single crystal silicon substrate 1 to form the N-type epitaxial silicon layer 2 on the surface by epitaxial growth. Then, the N$^+$-type embedded silicon layer 3 is formed at the interface of the single crystal silicon substrate 1 and the epitaxial silicon layer 2. Then, a dummy oxide film 20 is formed on the surface of the epitaxial silicon layer 2 by thermal oxidation.

Figure 2:
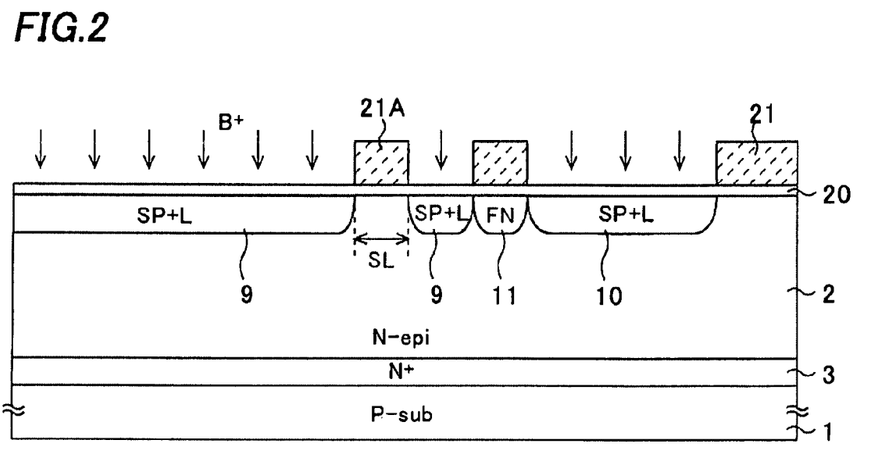
Figure 10:
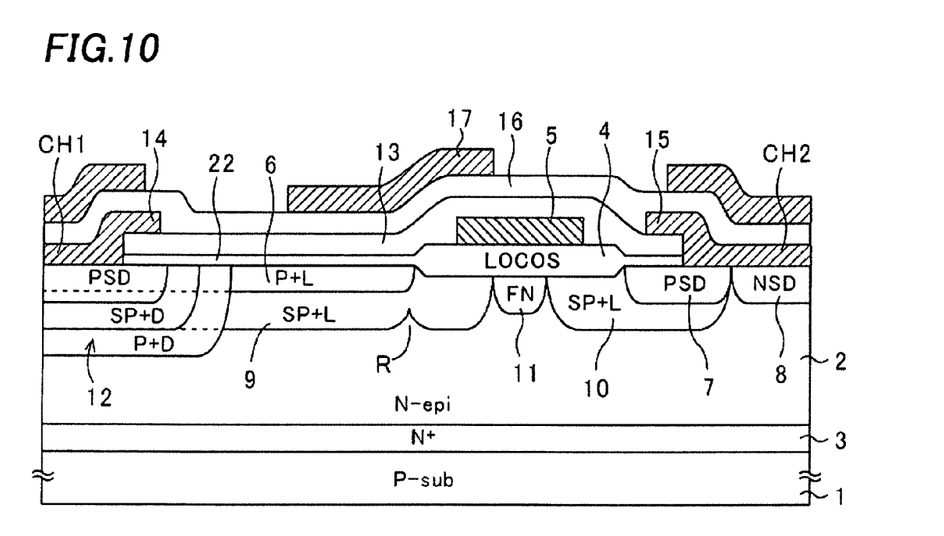
FIGS. 10 and 11 are cross-sectional views for explaining the semiconductor device of the embodiment of the invention.

Then, the second drift layer 9, the low concentration source layer 10 and the N-type channel impurity layer 11 are formed in corresponding regions respectively shown in FIG. 10 by ion implantation. FIG. 2 shows a process of forming the second drift layer 9 and the low concentration source layer 10 by ion implantation of boron (B+) using a photoresist layer 21 as a mask. By forming a photoresist piece 21A when the second drift layer 9 is formed by the ion implantation, a slit SL having a width corresponding to that of the photoresist piece 21A is formed under the photoresist piece 21A. The channel impurity layer 11 is formed by ion implantation of phosphorus (P+) under the condition of a dose $5 \times 10^{15}/cm^2$.

Figure 3:
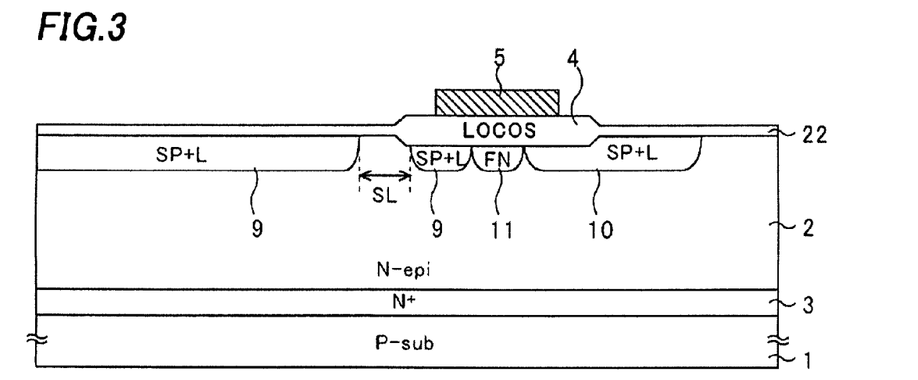

Then, after the photoresist layer 21 and the dummy oxide film 20 are removed, the LOCOS film 4 having a thickness of about 1000 nm is formed by selective oxidation as shown in FIG. 3. The left end of the LOCOS film 4 is located on the slit SL of the second drift layer 9. Then, the gate oxide film 22 having a thickness of 90 nm is formed. The gate electrode 5 having a thickness of about 400 nm is then formed on this LOCOS film 4. The gate electrode 5 is made of polysilicon, metal silicide having a high melting point, or the like.

Figure 4:
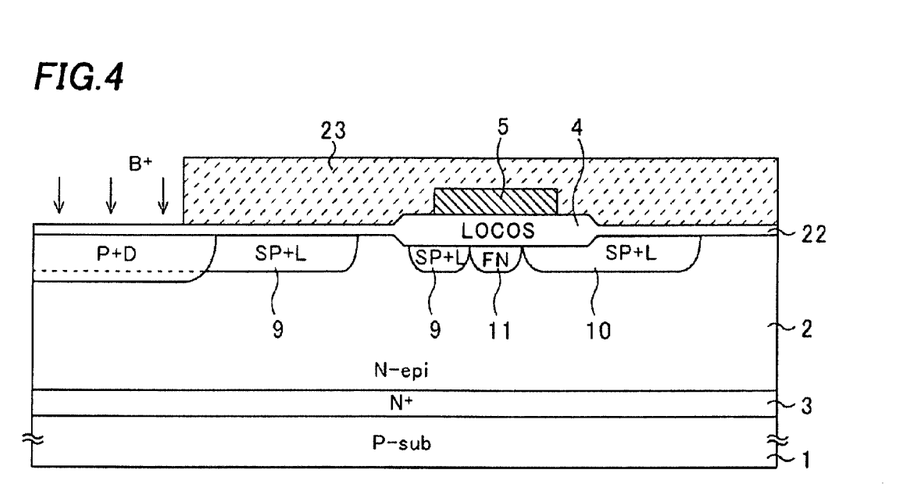

Then, as shown in FIG. 4, a photoresist layer 23 is formed, being provided with an opening in a region where the drain layer 12 shown in FIG. 10 is to be formed. The P+D layer of the drain layer 12 is formed by ion implantation of boron (B+) using this photoresist layer 23 as a mask. A dose of boron (B+) is about $1 \times 10^{13}/cm^2$.

Figure 5:
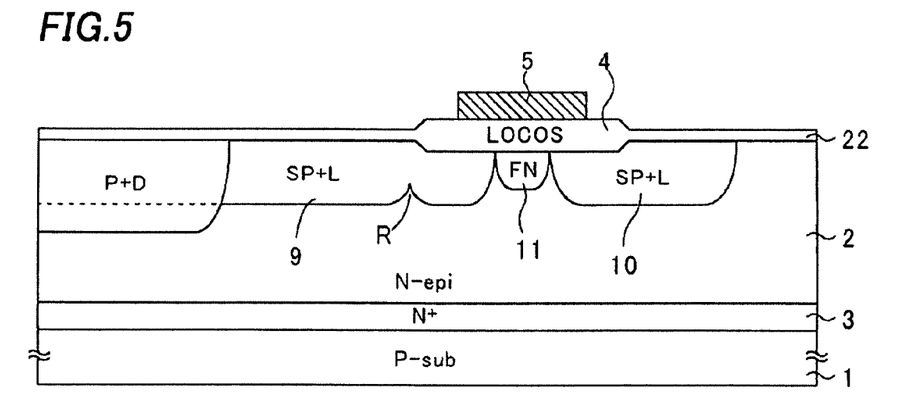

Then, after the photoresist layer 23 is removed, thermal diffusion is performed in N$_2$ atmosphere at a temperature of 1180° C. for four hours as shown in FIG. 5. By this process, the second drift layer 9, the channel impurity layer 11 and the P+D layer are diffused deep. By this thermal diffusion, boron is diffused in a lateral direction to narrow the width of the slit SL, and at last the upper portion of the slit SL is filled with boron to form the recess portion R in the bottom portion of the second drift layer 9.

Figure 6:
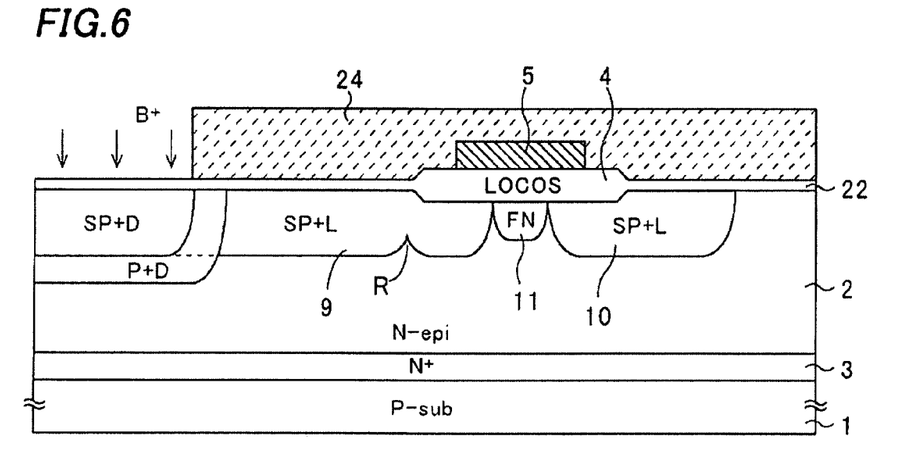
Figure 7:
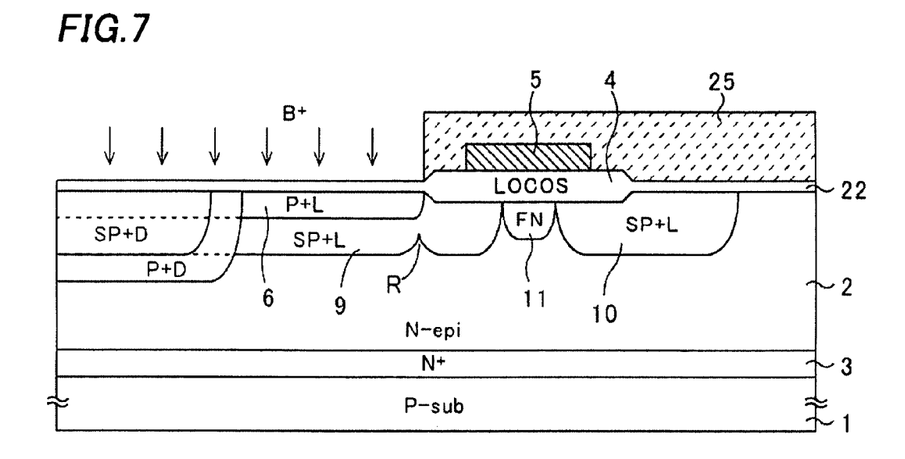

Next, as shown in FIG. 6, a photoresist layer 24 is formed, and the SP+D layer is formed in the P+D layer by ion implantation of boron (B+) using this photoresist layer 24 as a mask. Then, the photoresist layer 24 is removed, and thermal diffusion is performed at a temperature of 1050° C. for five hours or 1100° C. for 90 minutes. Then, as shown in FIG. 7, a photoresist layer 25 having an opening on the drain side is formed, and the first drift layer 6 is formed on the surface of the second drift layer 9 by ion implantation of boron (B+) using this photoresist layer 25 as a mask.

Figure 8:
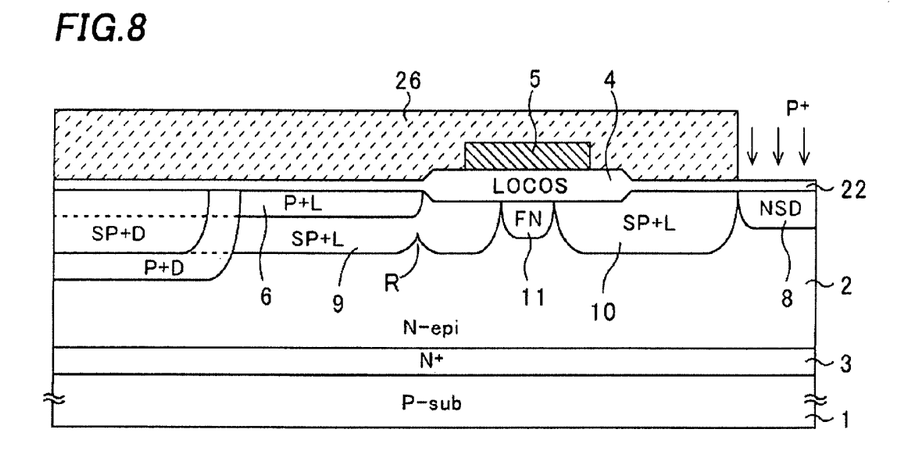
Figure 9:
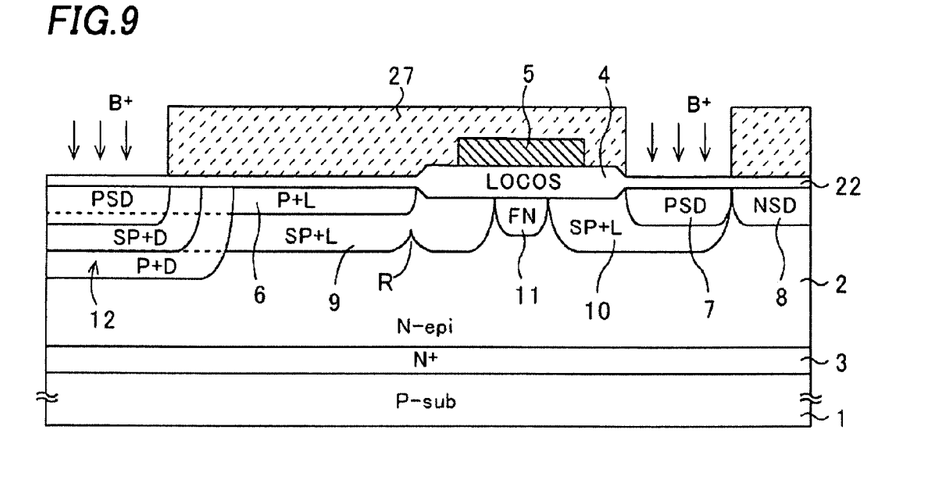

Then, after the photoresist layer 25 is removed, a photoresist layer 26 is formed, being provided with an opening in a region where the N$^+$ layer 8 is to be formed, and the N$^+$ layer 8 is formed by ion implantation of phosphorus (P+) using this photoresist layer 26 as a mask as shown in FIG. 8. Then, as shown in FIG. 9, a photoresist layer 27 is formed, being provided with openings in regions where the PSD layer of the drain layer 12 and the source layer 7 are to be formed respectively, and the PSD layer of the drain layer 12 and the source layer 7 are formed by ion implantation of boron (B+) using this photoresist layer 27 as a mask. A dose of boron (B+) is about $1 \times 10^{15}/cm^2$.

Then, as shown in FIG. 10, the first interlayer insulation film 13 having a thickness of about 1000 nm is formed over the gate electrode 5 by CVD, and the contact hole CH1 is formed in the first interlayer insulation film 13 and the gate oxide film 22 on the PSD layer of the drain layer 12 by etching. The drain electrode 14 made of the first metal layer such as aluminum is formed through this contact hole CH1, being in contact with the PSD layer of the drain layer 12. Furthermore, the contact hole CH2 is formed in the first interlayer insulation film 13 and the gate oxide film 20 on the source layer 7 and the N$^+$ layer 8 by etching. The source electrode 15 made of the first metal layer such as aluminum is formed through this contact hole CH2, being in contact with the source layer 7 and the N$^+$ layer 8. Then, the second interlayer insulation film 16 having a thickness of about 1000 nm is formed on the whole surface. The field plate 17 is further formed extending from above a portion of the gate electrode 5 to above a portion of the first drift layer 6 with the first interlayer insulation film 13 and the second interlayer insulation film 16 being interposed therebetween.

What is claimed is:

1. A semiconductor device comprising:
   a semiconductor layer of a first general conductivity type;
   a field insulation film disposed on the semiconductor layer;
   a gate electrode disposed on the field insulation film;
   a first drift layer of a second general conductivity type formed in the semiconductor layer on one side of the gate electrode;
   a source layer of the second general conductivity type formed in the semiconductor layer on another side of the gate electrode; and
   a second drift layer of the second general conductivity type formed in the semiconductor layer so as to be located under the first drift layer and to extend under the field insulation film, wherein a recess portion is formed in a bottom portion of the second drift layer under an end portion of the field insulation film, and the source layer is not electrically connected to the gate electrode.

2. The semiconductor device of claim 1, further comprising a field plate covering part of the gate electrode and part of the first drift layer and electrically connected to the source layer.

3. The semiconductor device of claim 2, wherein the field plate comprises a metal layer.

4. The semiconductor device of claim 1, wherein there is a separation between the first drift layer and the field insulation film.

5. A semiconductor device comprising:
a semiconductor layer of a first general conductivity type;
a field insulation film disposed on the semiconductor layer;
a gate electrode disposed on the field insulation film;
a first drift layer of a second general conductivity type formed in the semiconductor layer on one side of the gate electrode;
a source layer of the second general conductivity type formed in the semiconductor layer on another side of the gate electrode;
a second drift layer of the second general conductivity type formed in the semiconductor layer so as to be located under the first drift layer and to extend under the field insulation film; and
a channel layer of the first general conductivity type formed in the semiconductor layer, having a higher concentration of impurities than the semiconductor layer and being in contact with a bottom portion of the field insulation film, a top surface of the channel layer being covered by the field insulation film in its entirety,
wherein a recess portion is formed in a bottom portion of the second drift layer under an end portion of the field insulation film.

6. A semiconductor device comprising:
a semiconductor layer of a first general conductivity type;
a field insulation film disposed on the semiconductor layer;
a gate electrode disposed on the field insulation film;
a first drift layer of a second general conductivity type formed in the semiconductor layer on one side of the gate electrode;
a source layer of the second general conductivity type formed in the semiconductor layer on another side of the gate electrode;
a second drift layer of the second general conductivity type formed in the semiconductor layer so as to be located under the first drift layer and to extend under the field insulation film; and
a drain layer of the second general conductivity type formed in the semiconductor layer and being in contact with the first drift layer and the second drift layer,
wherein a recess portion is formed in a bottom portion of the second drift layer under an end portion of the field insulation film.

7. The semiconductor device of claim 1, wherein the semiconductor layer comprises an epitaxial semiconductor layer formed on a single crystal semiconductor substrate of the second general conductivity type and an embedded semiconductor layer formed between the single crystal semiconductor substrate and the epitaxial semiconductor layer.

8. The semiconductor device of claim 7, wherein an impurity concentration of the embedded semiconductor layer is higher than an impurity concentration of the epitaxial semiconductor layer.

* * * * *